United States Patent [19]
Chance

[11] Patent Number: 5,157,477
[45] Date of Patent: Oct. 20, 1992

[54] MATCHED IMPEDANCE VERTICAL CONDUCTORS IN MULTILEVEL DIELECTRIC LAMINATED WIRING

[75] Inventor: Dudley A. Chance, Newton, Conn.

[73] Assignee: International Business Machines Corporation, Armonk, N.Y.

[21] Appl. No.: 642,180

[22] Filed: Jan. 18, 1991

Related U.S. Application Data

[63] Continuation of Ser. No. 463,068, Jan. 10, 1990, abandoned.

[51] Int. Cl.⁵ .................... H01L 23/02; H01L 23/48
[52] U.S. Cl. ...................... 357/71; 323/358; 357/68; 357/65; 361/414
[58] Field of Search ........... 357/71, 65, 70, 68, 357/80; 361/414, 400; 333/328; 323/352

[56] References Cited

U.S. PATENT DOCUMENTS

| | | | |
|---|---|---|---|
| 4,295,183 | 10/1981 | Miersch et al. | 361/403 |
| 4,407,007 | 9/1983 | Desai et al. | 357/74 |
| 4,438,560 | 3/1984 | Kisters | 361/414 |
| 4,446,477 | 5/1984 | Currie et al. | 357/74 |
| 4,465,727 | 8/1984 | Fujita et al. | 428/138 |
| 4,494,172 | 1/1985 | Leary et al. | 361/400 |
| 4,524,239 | 6/1985 | Rouge | 361/414 |
| 4,535,388 | 8/1985 | Kraus et al. | 361/414 |
| 4,551,747 | 11/1985 | Gilbert et al. | 357/74 |
| 4,626,889 | 12/1986 | Yamamoto et al. | 357/51 |
| 4,636,919 | 1/1987 | Itakura | 361/414 |
| 4,641,425 | 2/1987 | Dubuisson et al. | 29/830 |
| 4,649,417 | 3/1987 | Burgess et al. | 357/80 |
| 4,736,521 | 4/1988 | Dohya | 29/830 |
| 4,800,459 | 1/1989 | Takagi et al. | 361/321 |
| 4,821,007 | 4/1989 | Fields et al. | 333/238 |
| 4,827,327 | 5/1989 | Miyauchi et al. | 357/71 |
| 4,858,077 | 8/1989 | Shirohara et al. | 357/51 |
| 4,861,616 | 1/1990 | Renken et al. | 333/236 |
| 4,864,722 | 9/1989 | Lazzarini et al. | 361/414 |
| 4,956,749 | 9/1990 | Chang | 361/414 |

FOREIGN PATENT DOCUMENTS

| | | | |
|---|---|---|---|
| 0035093 | 9/1981 | European Pat. Off. | 361/414 |
| 0198698 | 10/1986 | European Pat. Off. | |
| 0285064 | 5/1988 | European Pat. Off. | |
| 2563656 | 10/1985 | France | |
| WO8401470 | 12/1984 | PCT Int'l Appl. | |

OTHER PUBLICATIONS

IBM Technical Disclosure Bulletin, vol. 32, No. 10B, pp. 256-258, "Low Inductance Multilevel Ceramic Module".

Microelectronics Packaging Handbook edited by R. R. Tummala and E. J. Rymaszewski, Van Nostrand, 1985, pp. 18, 138 and 154.

"Reference Data for Radio Engineers", fourth edition, International Telephone and Telegraph Corporation, 1963, p. 591.

Primary Examiner—Andrew J. James
Assistant Examiner—Viet Q. Nguygen
Attorney, Agent, or Firm—Daniel P. Morris; Alvin J. Riddles

[57] ABSTRACT

Electrical impedance matching for through plane connections or vias in a multiplane laminated wiring structure is provided by arranging the vias in patterns conforming to a standard characteristic impedance configuration. The pattern may be a five wire configuration with four vias surrounding the fifth and repeated over the area of the plane.

7 Claims, 4 Drawing Sheets

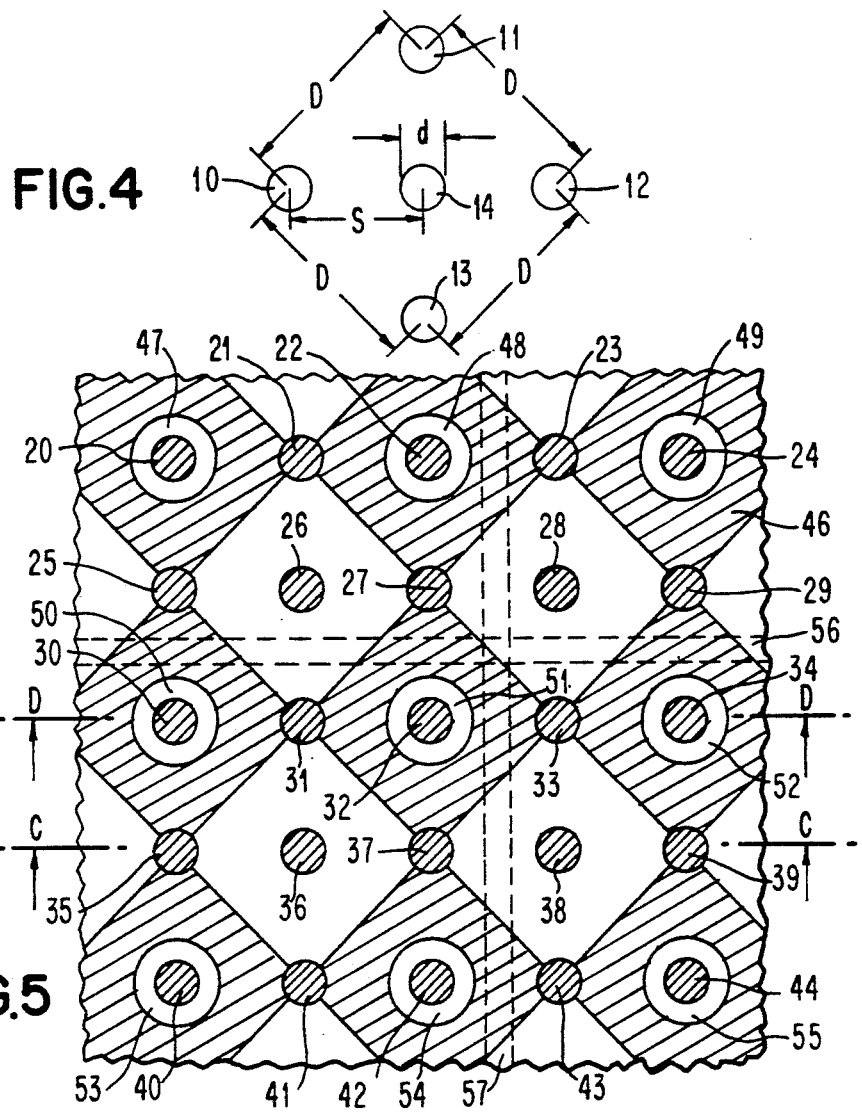
FIG.4
FIG.5
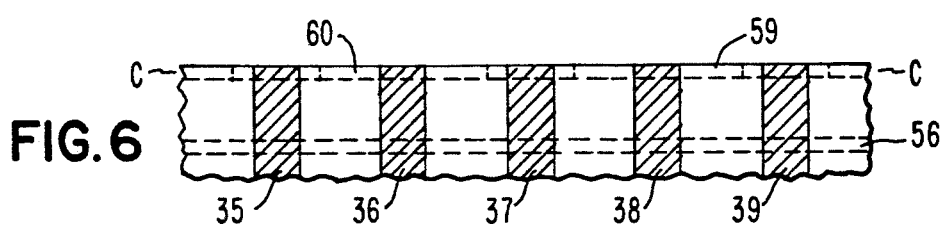
FIG.6
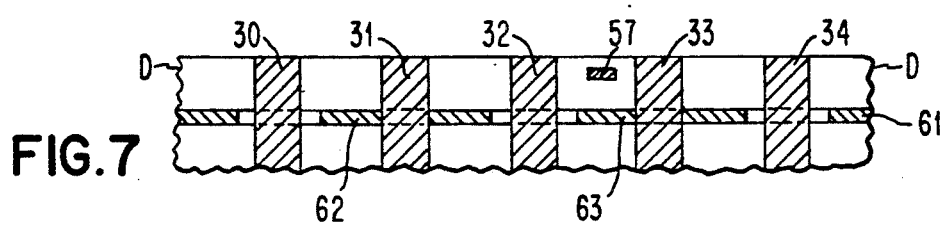
FIG.7

FIG. 8
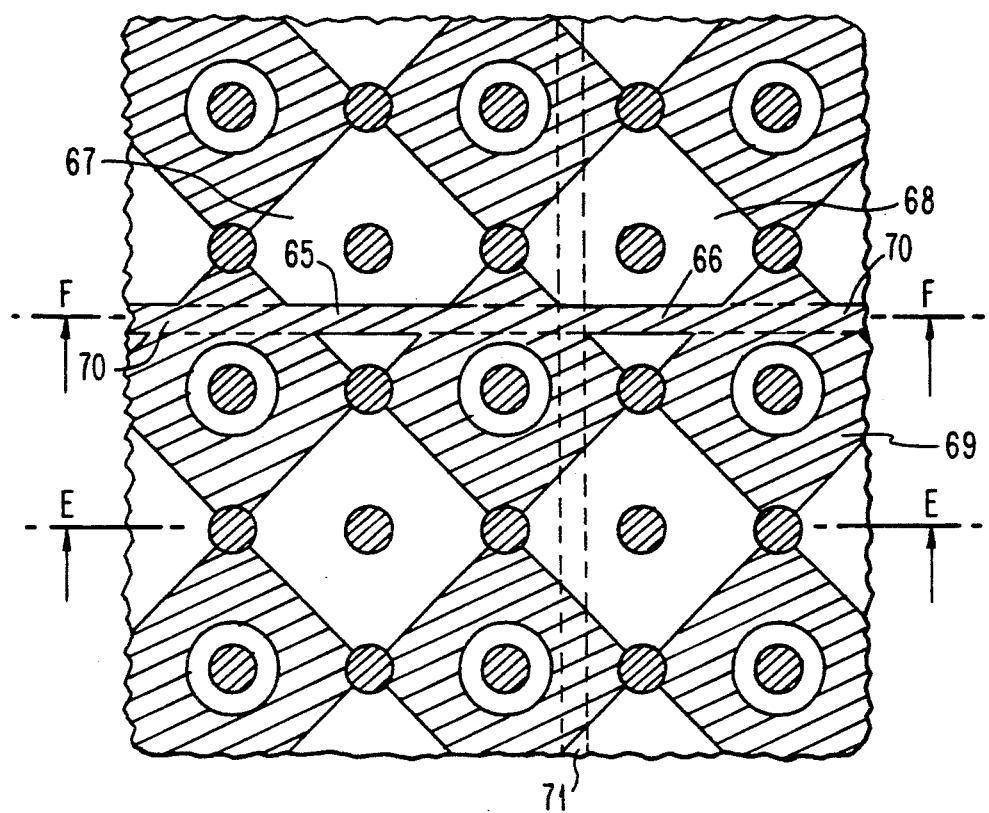
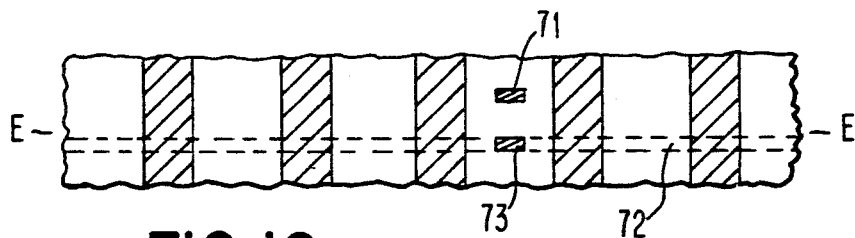
FIG. 10
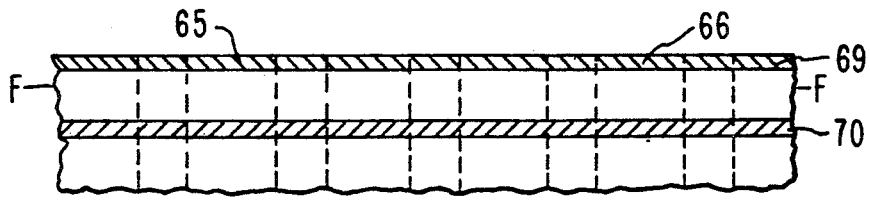
FIG. 9

MATCHED IMPEDANCE VERTICAL CONDUCTORS IN MULTILEVEL DIELECTRIC LAMINATED WIRING

This application is a continuation of application Ser. No. 07/463,068 filed Jan. 10, 1990 now abandoned.

TECHNICAL FIELD

The invention relates to impedance matching in the vertical or interplane conductors of multiplane or multilevel wiring structures.

The invention is of particular value in the semiconductor integrated circuit field where the combined progressively more stringent requirements of packaging density and speed of operation are making wiring structures difficult to configure.

BACKGROUND OF THE INVENTION

In multiplane or multilevel wiring technology, a number of relatively thin substrates are used to support conductor patterns and are assembled into a laminar stack with connections that have come to be known in the art as vias extending through the laminations and interconnecting the wiring on the individual laminations. The technology is usually practiced using patterned conductor deposition techniques that after assembly in a stack the patterns are interconnected through hole patterns aligned between some or all laminations into a unitary wiring package. In the semiconductor technology, the semiconductor chips are usually positioned on the upper surface of the stacked wiring package.

As the overall performance specifications have increased, the wiring structures have been assembled with the high frequency impedance parameters becoming a more prominent consideration.

In the Microelectronics Packaging Handbook edited by R. R. Tummala and E. J. Rymaszewski, Van Nostrand, 1985, pages 18, 138 and 154, there is recognition of the impedance problem.

As the number of laminations still further increased, and the current carrying requirements of power conductors as contrasted with signal conductors became greater, techniques appeared in the art in U.S. Pat. Nos. 4,649,417 and 4,827,327 that distinguished in the wiring structure between signal and power conductors. A limiting aspect of such an approach to the problem is that a very early decision must be made as to where which type is to be located which reduces flexibility in assembling the wiring configuration.

Heretofore in the art, the impedance problem could be contained. Reference metallization was used to control the impedance of the conductors on the lamination surfaces and the few mils of lamination thickness did not produce significant signal delays where the vias passed through the dielectric.

The performance required in the art has now reached the point where delays in signal transmission in the picosecond range, as is encountered in a mismatched impedance via passing through a few plane pairs of dielectric laminations, can no longer be tolerated.

SUMMARY OF THE INVENTION

The invention provides impedance matching capability for the through plane vias in a multiplane laminated wiring structure by arranging vias in patterns conforming to a standard "characteristic impedance" type configuration. The pattern may be a central via surrounded by peripheral vias. The invention is particularly advantageous in multilevel configurations when employed in a repeating five wire "characteristic impedance" configuration with four vias on a grid surrounding the fifth.

BRIEF DESCRIPTION OF THE DRAWINGS

FIG. 4 is an illustration of the critical dimensions of the 5 wire "characteristic impedance" type configuration.

FIGS. 5 to 7 are a top view and two cross sectional views at different locations illustrating the patterned via configuration of a glass ceramic module integrated circuit embodiment of the invention.

FIGS. 8 to 10 are a top view and two cross sectional views at different locations illustrating the location of lines in reference planes to improve zig-zag current path in an integrated circuit glass ceramic module embodiment of the invention.

BEST MODE DESCRIPTION OF THE INVENTION

Heretofore in the art, multiplane wiring assemblies or modules have been constructed of layers of wiring patterns separated by relatively thin layers of insulating materials with connections to points in the layers made by conductors called vias running from plane to plane and wherein the signal transmission electrical performance, that is the inductive and capacitive impedance effects were controlled using a type of construction known as the plane pair where a reference conductive plane was positioned between conductor planes. This type of multiplane or multilevel wiring is illustrated in connection with FIGS. 1, 2 and 3 wherein in FIG. 1 there is shown a top view and two cross sectional views of the plane pair type of module construction.

Figure 1:
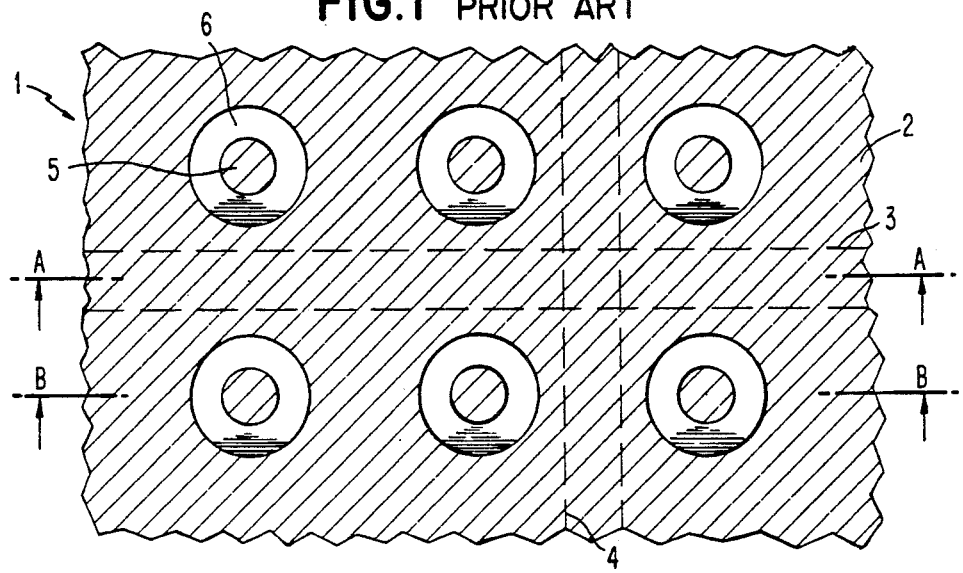
FIGS. 1 to 3 are a top view and two cross sectional views at different locations illustrating the prior art "plane pair" type laminated wiring structure.

Referring to FIG. 1, in a section 1 of a plane of the assembly, there is an area 2 of conductive material that serves as an electrical reference. In these modules the wiring is distributed on the superimposed planes usually in orthogonal directions. This is illustrated in FIG. 1 by the x-line shown dotted as element 3 and the y-line shown dotted as element 4. Connections to the wiring on the planes is made through a pattern of which six are shown in FIG. 1 of z-direction conductors or vias 5. The reference plane material 2 is separated from each of the vias 5 by a clearance separation shown as element 6.

Figure 2:
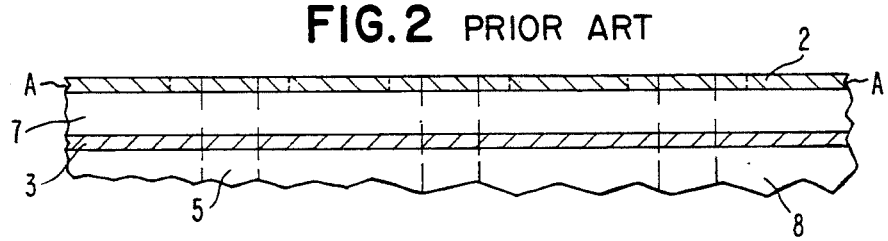

Referring to FIG. 2, a cross sectional view of the portion of the module of FIG. 1 is shown taken along the lines A—A. In FIG. 2, the electrical reference 2 is shown separated from the x line 3 by a layer 7 of insulating or dielectric material and in turn from other layers below the x line 3 only a portion of a second layer 8 being shown.

Figure 3:
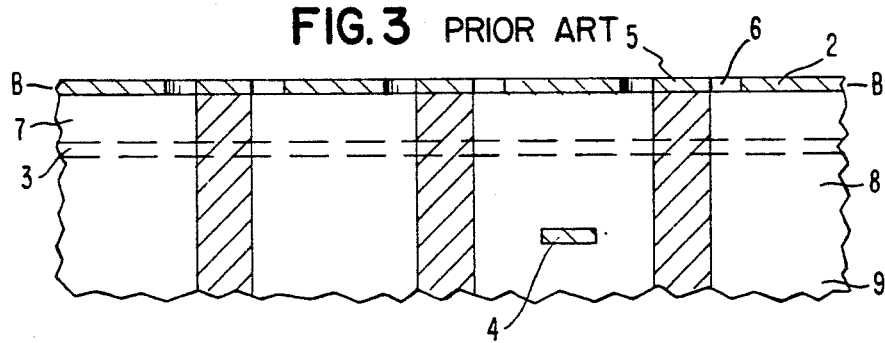

Referring next to FIG. 3, another cross sectional view of the portion of a module shown in FIG. 1 is shown taken along the lines B—B through the vias. In FIG. 3 the conductive area 2 is shown with openings 6 surrounding each via 5 and with the y line 4 separated from adjacent planes by the insulating layers 8 and 9. In manufacturing, layers of insulating material are made up with wiring and via segments while in a green or uncured state. The overall laminated structure is subjected to a processing operation that coalesces the insulating layers, conductors and vias into a unitary element or module. This processing operation results in demarcation lines between insulating layers losing definition so that none is shown in FIG. 3.

As the module becomes larger, signal propagation delays, due to impedance effects of inductive and capacitive reactance, become encountered. The inductive and capacitive impedance effects have been controlled in the plane pair type module of FIGS. 1-3 by electrical transmission line type design of the geometry of the lines and their position relative to the electrical reference areas, and the dielectric constant and thickness of the insulating material. Such efforts obtain matching impedances for the driving circuits and terminations in the x-y planes but as the number of laminations increases the part of the interconnections that travel in the z or vertical direction through the vias begins to have a significant effect. The proximity of planes and the density driven reduction of clearance hole sizes cause impedance mismatch and slowing of signal speed.

In accordance with the invention, impedance matching capability for the through plane vias is provided by a via arrangement in patterns conforming to a standard characteristic impedance type configuration. The pattern may be a central via accompanied by several peripheral vias. In electrical design, the characteristic impedance for various configurations have been set forth in handbooks. The reference plane of the plane-pair type structure is based on the strip-line characteristic impedance known in the art. The invention employs repeating patterns of vias in modules in a characteristic impedance type configuration for multiple conductors. The invention is particularly advantageous when the 5 wire characteristic impedance configuration is used. In the 5 wire configuration is added the signal carrying via which is placed equidistant from each 4 member combination of the repeating grid. The 5 wire configuration is shown in FIG. 4. In FIG. 4, in a grid of 4 vias 10, 11, 12 and 13 separated from each other by a distance D, there is centrally located a via 14 spaced from each of the vias 10-13 by a distance S. The vias 10-14 all have the same diameter d.

The 5 wire configuration characteristic impedance $Z_0$ has been published in the text Reference Data for Radio Engineers, fourth edition, by International Telephone and Telegraph Corporation, 1963, page 591, wherein for the condition where the via diameter d is less than the separation distance D the characteristic impedance is described by Equation 1.

$$Z_0 = \frac{173}{\sqrt{\epsilon}} \log_{10} \frac{D}{0.993d} \qquad \text{Equation 1}$$

where $\epsilon$ is the dielectric constant

In accordance with the invention, using glass ceramic as the insulating or dielectric material with a dielectric constant of 5, the characteristic impedance is expressed in accordance with Equation 2.

$$Z_0 = 77.4 \log_{10}(1.516\ S/d) \qquad \text{Equation 2}$$

where S=0.707 D and is the separation distance between the central via and the members of the grid Further, in accordance with the invention, taking a design characteristic impedance goal of 50 ohms, the via spacing is related to the via diameter by 2.87.

Thus, in FIG. 4, a central via 14 with a diameter of 3.48 mils surrounded by similar vias 11, 12, 13 and 14 at a 10 mil separation distance provides a transmission line with a characteristic impedance of 50 ohms.

Further examples of the 50 ohm, 2.87 spacing to via diameter ratio for the glass ceramic dielectric constant of 5 example are listed in Table 1.

TABLE 1

| Via Diameter (d) in Mils | Via Spacing (S) in Mils |
|---|---|
| 3.9 | 11.3 |
| 3.5 | 10 |
| 2.8 | 8 |
| 2.1 | 6 |

Referring next to FIGS. 5, 6 and 7, there is shown a portion of a multilevel module employing the characteristic impedance configuration via arrangement of the invention. FIG. 5 is a top view and FIGS. 6 and 7 are cross sectional views at different locations showing the 5 wire via configuration. In FIG. 5, the characteristic impedance for each of vias 20-44 in the repeating grid of vias is the design value. The electrical reference conductive area 46 is provided with circular clearance areas 47-55 around vias 20, 22, 24, 30, 32, 34, 40, 42 and 44 and open areas between repeating patterns surrounding vias 26, 28, 36 and 38 resulting in alternate pattern areas being covered. The x and y line buried conductors are labelled 56 and 57, respectively.

Referring next to FIG. 6 which is a cross sectional view of FIG. 5 along the line C—C through vias 35-39. In FIG. 6, the portions of the electrical reference area 46 of FIG. 5 are labelled 59 and 60. The x line is labelled 56. In FIG. 7, there is shown a cross section of FIG. 5 extended in the region below the y line 57 to show the next electrical reference area labelled 61 with the portions of the area 61 at the D—D line being labelled 62 and 63.

The number of signal vias in FIG. 5 is one-fourth the total number and with that pattern areas under a chip can be used for conductors having matched transmission lines in all three x, y and z directions as well as sufficient vias for supplying power to the chip.

It should be noted that the conductive portion of the electrical reference area 46 in FIG. 5 having the pattern of open areas may under certain conditions instead of following a signal line present a zig-zag path. Where this is a problem, short strips of lines may be incorporated in the layout corresponding to the path of the signal line.

The selection of conductor location, electrical reference area shape and conductor and via assignment is made for each plane of the structure and the conductive material applied prior to assembling and coalescing the entire laminate into a unitary module.

Referring next to FIGS. 8, 9 and 10, the placing of selected short strips in open areas of an electrical reference area is illustrated for a portion of a module with FIG. 8 being a top view and FIGS. 9 and 10 being cross sectional views at different locations. In FIG. 8 short strips 65 and 66 have been programmed into the layout of the conductive material 69 on the plane to cross open areas 67 and 68 adjacent to buried x line 70. The buried y line is labelled 71.

A cross sectional view is shown in FIG. 9 along the line F—F of FIG. 8 showing the x line 70 and the strips 65 and 66 in the electrical reference area 69.

In FIG. 10 a cross sectional view of FIG. 8 is shown illustrating the programmed addition of material 73 in the electrical reference area 72 in the plane under and adjacent to the y line 71.

Figure 11:
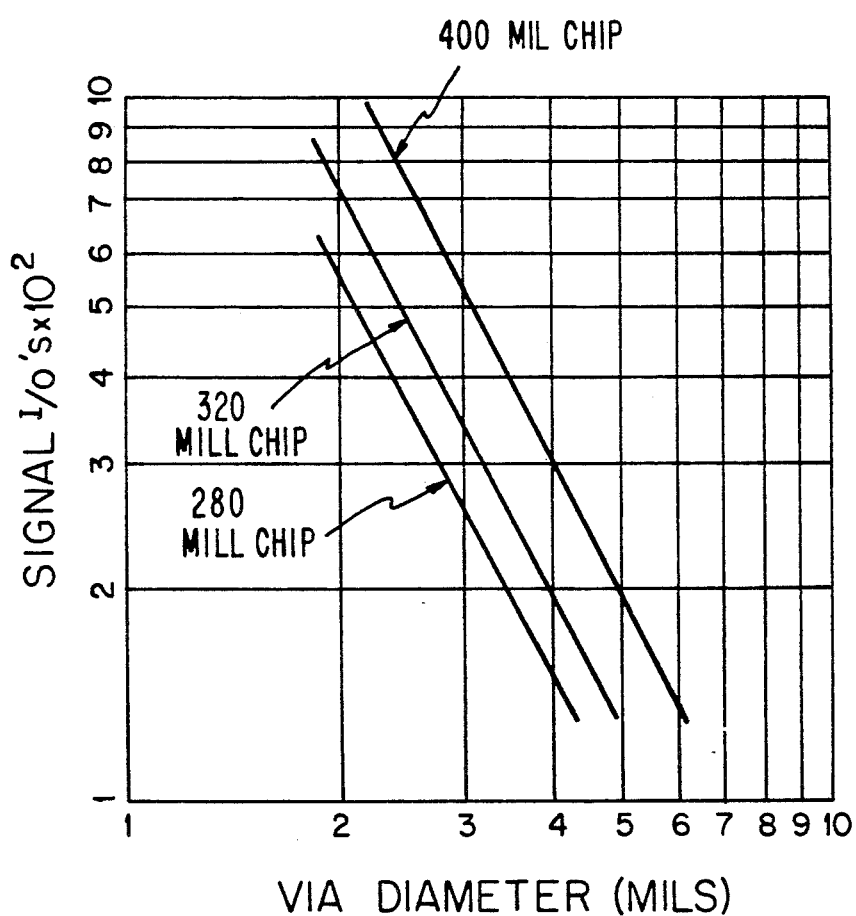
FIG. 11 is a logarithmic scale graph showing the relationship between the size of chips, the number of via input-output (I/O) terminals and via diameters for a glass ceramic module integrated circuit embodiment of the invention.

The via impedance matching capability of the invention permits areas under a chip to be used for conductors having matched transmission line impedance characteristics in all three directions as well as providing sufficient vias for supplying power to the chip. Each matched impedance via that passes through a plane pair in a module with insulating material with a dielectric constant of 5, such as glass ceramic, eliminates about a 3 picosecond signal delay. The via diameters have a correlation with the size of the chips and the number of signal input-output (I/O's) when the invention is employed. The graph of FIG. 11 illustrates the relationship in orthogonal logarithmic scales for three progressively larger chip sizes.

What has been described is an impedance matching capability for vias or the z direction of a laminated wiring module that eliminates delays in signal propagation due to inductive or capacitive loadings in travelling through planes at different voltages.

Having thus described my invention, what I claim as new and desire to secure by letters patent is:

1. An electrical wiring structure comprising in combination,
    a plurality of superimposed planes of x and y direction electrical wiring conductors,
        each plane of said electrical wiring conductors being separated by a layer of dielectric material from a parallel plane of broad area reference potential conductive material,
    at least one z direction wiring conductor interconnecting via member passing through at least one said layer of dielectric material and interconnecting at least one said wiring conductor in one plane with at least one said wiring conductor in at least one other plane,
    each said via member being a conductor configuration comprising a central signal member surrounded by, and equidistant from, equidistant peripheral reference potential members,
    said central signal member and surrounding reference potential member configuration further having a member size and member position relationship for defining a specific electrical characteristic impedance and,
    each portion of said broad area reference potential conductor material enclosed by said peripheral members being free of reference potential conductive material.

2. The electrical wiring structure of claim 1 wherein in each said portion that is free of reference potential conductive material there is positioned a conductor width strip of conductive material adjacent any single underlying conductor separated by a single dielectric layer.

3. The wiring structure of claim 1 wherein there are four equidistant peripheral members.

4. The wiring structure of claim 3 wherein said dielectric of said dielectric layers are of coalesced glass ceramic.

5. An electrical wiring module exhibiting
    electrical transmission line characteristic impedance properties in all of x, y, and z directions comprising in combination,
    superimposed planes of x and y direction conductors, the conductors in each direction being supported by a dielectric layer that separates the conductors from a parallel plane of reference potential conductive material, and,
    at least one connection in the z direction joining at least one said conductor in one said plane with at least one said conductor in another of said planes,
        said z direction connection being a spaced configuration of a central signal element equally spaced from equally spaced peripheral reference potential elements,
        said peripheral reference potential elements surrounding a portion of a plane of reference potential conductive material that is free of reference potential conductive material, and
        said peripheral reference potential elements having a size and position relationship for defining a specific electrical characteristic impedance.

6. The electrical wiring module of claim 5 wherein in each said portion of a plane of reference potential conductive material that is free of conductive material there is positioned a conductor width strip of conductive material adjacent any single underlying conductor separated by a single dielectric layer.

7. In the electrical wiring module of claim 6 said dielectric being of glass ceramic material.

* * * * *